(12) United States Patent
McLaurin et al.

(10) Patent No.: US 6,598,192 B1
(45) Date of Patent: Jul. 22, 2003

(54) METHOD AND APPARATUS FOR TESTING AN INTEGRATED CIRCUIT

(75) Inventors: Teresa L. McLaurin, Dripping Springs, TX (US); Donald L. Tietjen, Austin, TX (US); Alfred L. Crouch, Austin, TX (US); Kristen L. Mason, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/513,867

(22) Filed: Feb. 28, 2000

(51) Int. Cl.[7] .......................... G01R 31/28; G06F 11/00

(52) U.S. Cl. ....................... 714/726; 714/744

(58) Field of Search ................. 714/726, 727, 714/732, 724, 731, 744

(56) References Cited

U.S. PATENT DOCUMENTS

| 5,422,858 | A | * | 6/1995 | Mizukami et al. | 714/724 |
| 5,524,114 | A | * | 6/1996 | Peng | 714/724 |
| 6,115,836 | A | * | 9/2000 | Churchill et al. | 714/726 |
| 6,195,772 | B1 | * | 2/2001 | Mielke et al. | 714/724 |
| 6,378,098 | B1 | * | 4/2002 | Yamashita | 714/742 |

* cited by examiner

Primary Examiner—Albert Decady
Assistant Examiner—Matthew C. Dooley
(74) Attorney, Agent, or Firm—James L Clingan, Jr.

(57) ABSTRACT

A programmable clock generator (220), which is part of an integrated circuit (IC) (210), provides clock signals (230) and (232) to various components of the IC. The clock generator includes a PLL (322) and one or more choppers (326, 328) which provide a desired waveform to the IC for testing purposes. When used in conjunction with a tester (212, 312), the IC can be scan tested at-speed using slower and less expensive testing equipment.

10 Claims, 5 Drawing Sheets

METHOD AND APPARATUS FOR TESTING AN INTEGRATED CIRCUIT

FIELD OF THE INVENTION

The present invention relates to the testing of integrated circuits (IC), and in particular, the present invention relates to the testing of integrated circuits where certain desired clock waveforms are required to achieve a desired result.

RELATED ART

After an integrated circuit is manufactured, it is put through a series of tests. One of these tests is a scan-based structural test. When performing scan-based structural testing, several problems must be addressed.

One problem relates to the capabilities of the automatic test equipment (ATE), or IC tester. Applying at-speed scan vectors or AC scan vectors requires test equipment that has the ability to apply clock cycles at the speed of the fastest clock specified by the IC being tested. For example, to perform an at-speed test for a 200 MHz IC (for timing verification), a tester must apply a 200 MHz clock cycle. Some testers have the ability to multiplex signals which allows the signals to be applied at twice the rated speed of the tester, but that may still not be fast enough for the speed of some devices. In addition, a tester may also not be able to provide the clock edge-rates (the rate at which the clock signal transitions from low to high, or from high to low) required by some devices. As the speed and precision of testers increases, so does its cost. Since the cost of the tester significantly affects the cost of a tested device, less expensive testers are desired.

Another problem relates to the pads on the integrated circuit. Even if a fast enough and accurate enough tester is available, the capability of the pads may be a problem. The pads may be a limitation that negates the capabilities of the tester. First, pads that can handle the speed of the clock from the tester may not be available. In addition, any signal passing through the pad may be degraded by the pad.

Another problem relates to the power consumed by device during the testing process. When performing scan testing, there is a possibility of a high toggle rate and, therefore, high power consumption. To reduce the power consumed by the integrated circuit during testing, it is desirable to reduce the toggle rate, where the toggle rate includes the number of transitions or the frequency of the data.

It should also be noted that embedded cores have aggressive clocking requirements and are required to be tested for structure and for specifications after they are embedded. This type of testing can not always be done with "functional" vectors since cores have limited access. Therefore, many embedded cores require AC scan for "timing defects" and simple timing specification verification.

Following is a description of one prior art attempt at overcoming some of the problems encountered during scan testing. During scan testing, the launch to capture cycle is the only cycle that tests the functional paths of the device being tested. Therefore, this is the only cycle-to-cycle period that must be applied at the maximum frequency to test the device at its rated speed during scan testing. This prior art attempt assumes that there are two clock domains, the core and the peripheral logic. This prior art testing method uses a methodology, using bypass test clocks, which allows scan data shifting at a slow speed and conducting the functional capture operation at a high speed. This testing method also uses the pin multiplexer timing on the tester. FIG. 1 is a timing diagram illustrating how the automated test pattern generator (ATPG) clock data can be manipulated in order to create waveforms that test the launch to capture cycle speed. FIG. 1 shows peripheral and core clock signals 10 and 12. In addition, FIG. 1 shows a waveform 14 created such that there is still only one clock per interval, but the correct timing relationship is installed to test the launch to capture cycle at the desired speed. The waveform of the clock signal 14 is controlled based on the core clock pattern data which is also shown in FIG. 1. It can be seen that there is only one pulse per interval (between the solid lines), but the second pulse 16 (launch) and third pulse 18 (capture) are positioned close to each other to simulate a faster speed. In this way, a device can be tested using a slower tester. However, even with this solution, the pads of the device being tested must be able to handle the fast speed. In addition, even if a tester is fast enough to work under this testing method, when the abilities of a tester are pushed, the tester does not work well close to its limits. Other problems with this approach include insufficient edge rate and high power consumption potential.

BRIEF DESCRIPTION OF THE DRAWINGS

The present invention is illustrated by way of example and not limited in the accompanying figures, in which like references indicate similar elements, and in which.

DETAILED DESCRIPTION

Figure 1:
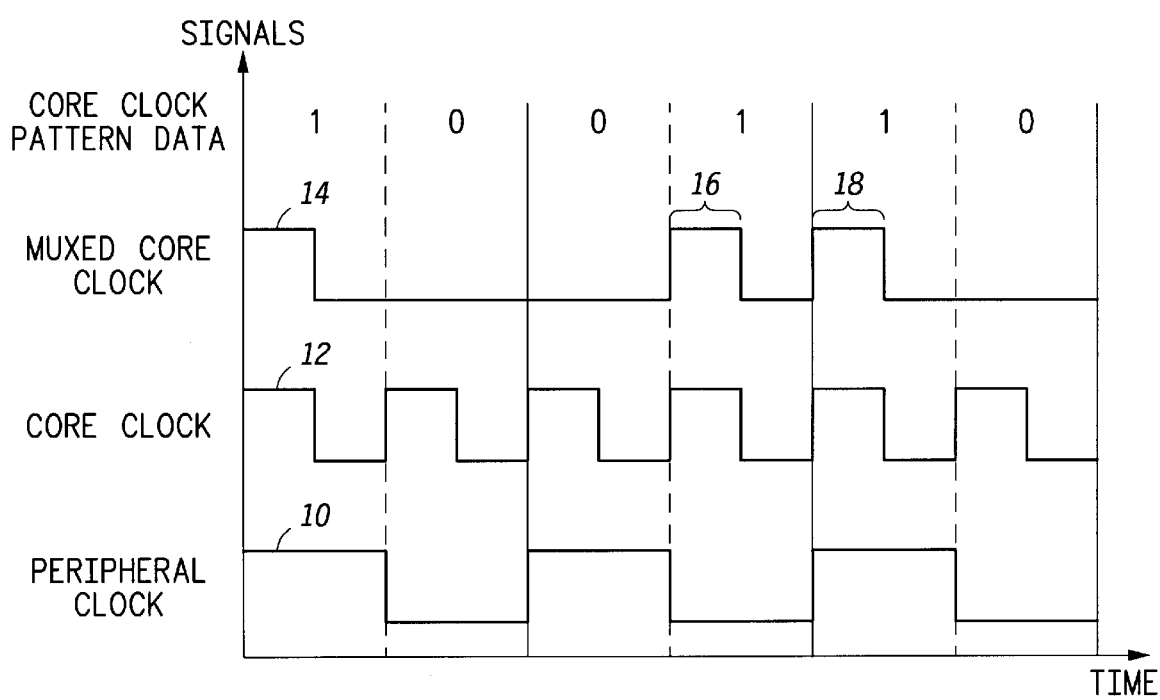
FIG. 1 is a timing diagram for a prior art testing methodology.
Figure 2:
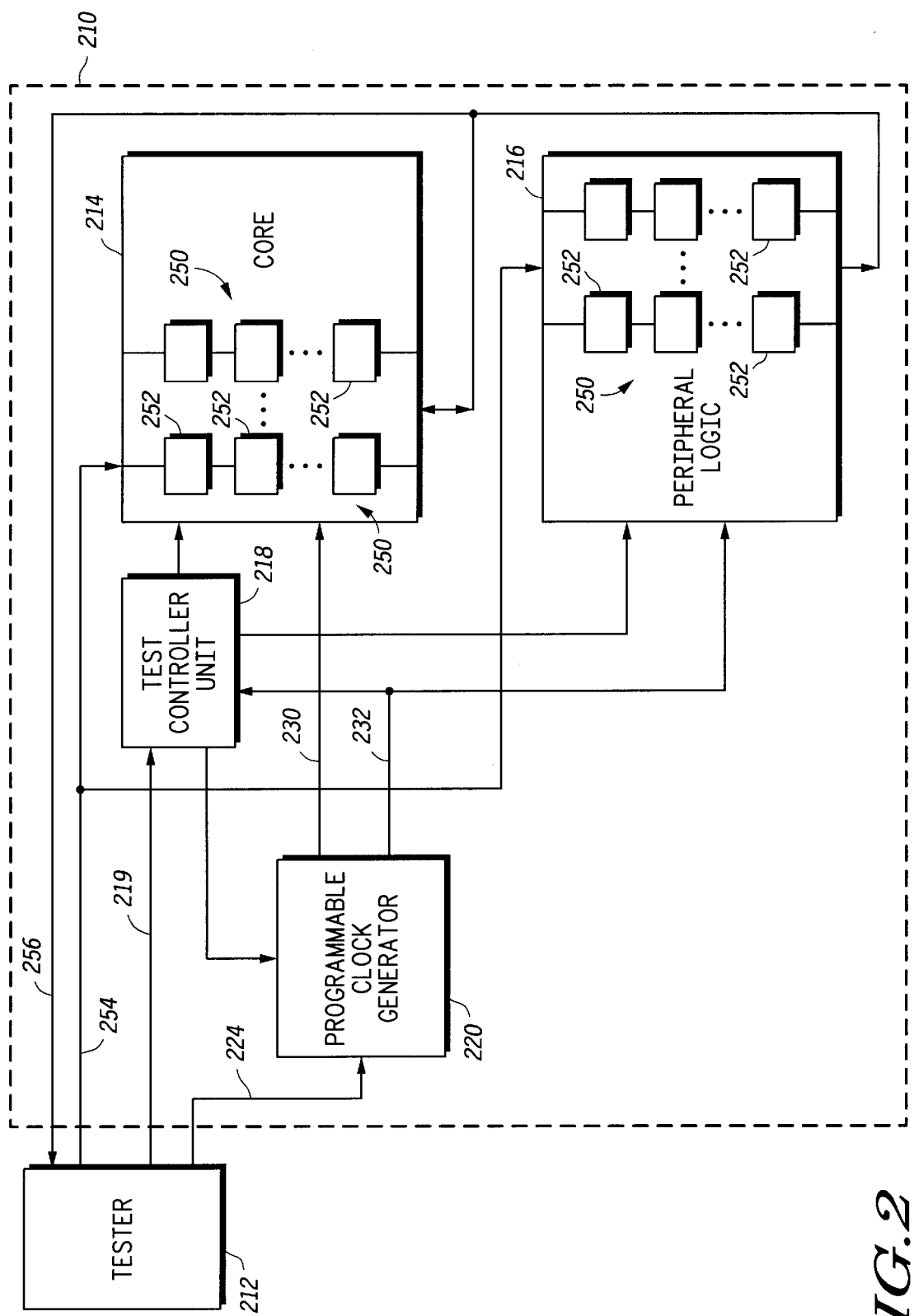
FIG. 2 is a block diagram of an integrated circuit and a tester.

FIG. 2 is a block diagram of an IC 210 shown connected to a tester 212. The tester 212 is comprised of automated test equipment (ATE). The IC 210 shown in FIG. 2 includes an embedded core 214 and peripheral logic 216. For purposes of clarity, FIG. 2 shows only one core 214. However, other cores may be present on the IC 210. Similarly, FIG. 2 shows peripheral logic 216 that has one clock domain. Other peripheral logic blocks may be included on the IC 210 with other clock domains. A programmable clock generator 220 (described in detail below) is connected to a test clock input (input clock signal 224) from the tester 212, and provides clock signals 230 and 232 to the core 214 and peripheral logic 216. As is described in detail below, the programmable clock generator 220 manipulates the phase locked loop (PLL) output clock signals on a cycle-by-cycle basis. FIG. 2 also shows a test controller unit 218. The test controller unit 218 provides various control signals to the core 214, peripheral logic 216, and programmable clock generator 220. The test controller unit 218 controls most aspects of the testing process. FIG. 2 also shows a connection 219 between the tester 212 and the test controller unit 218. When testing the IC 210, the tester 212 provides test control signals to the test controller unit 218 which put the IC 210 in a test mode.

Figure 3:
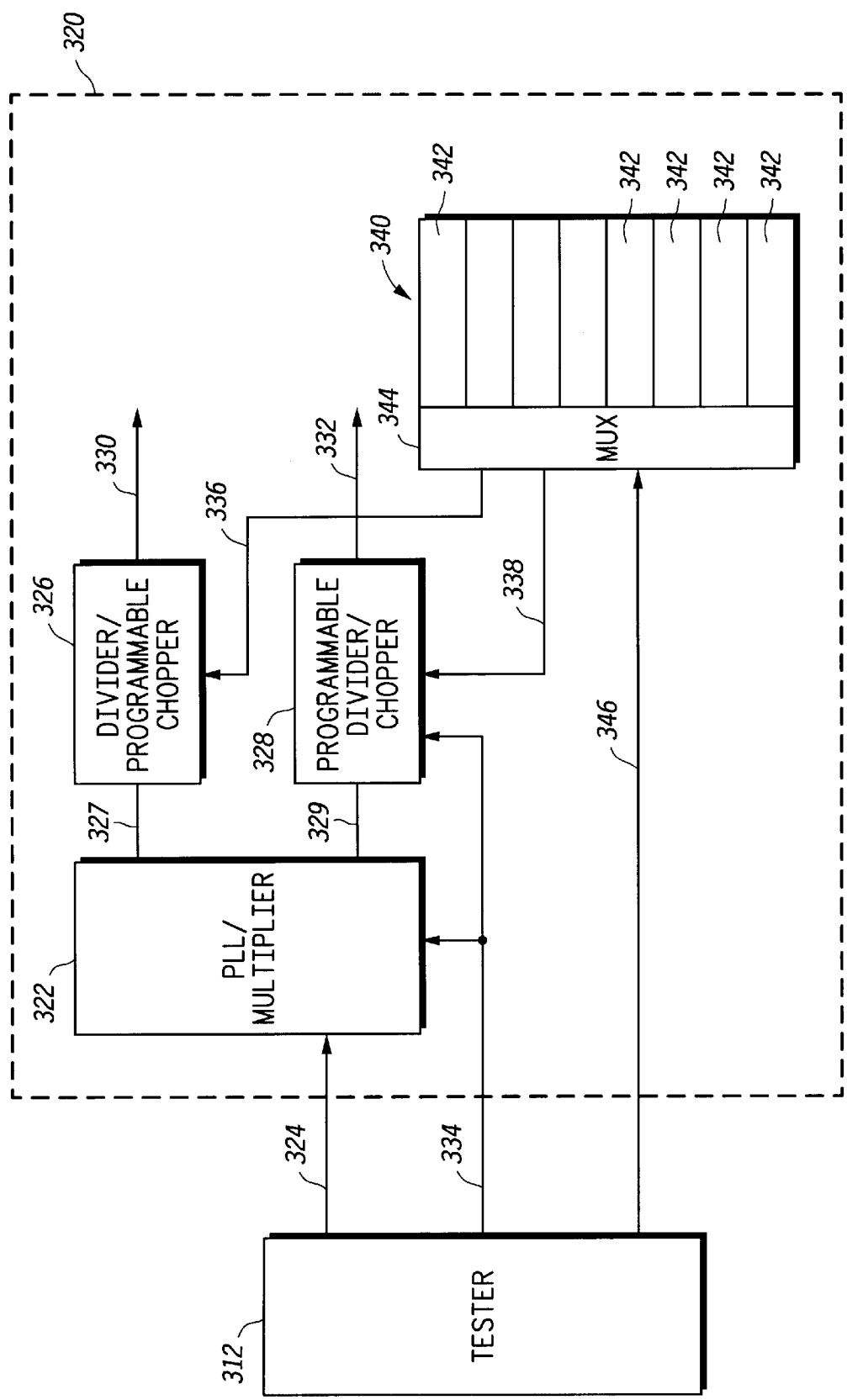
FIG. 3 is a block diagram of the programmable clock generator of the present invention connected to a tester.

FIG. 3 is a block diagram of a programmable clock generator 320 connected to a tester 312. As shown in FIG. 3, the programmable clock generator 320 includes a PLL/multiplier 322 connected to the tester 312. The tester 312 provides an input clock 324 to the PLL 322. The PLL 322 is connected to a divider/programmable chopper 326 and to a programmable divider/chopper 328. The PLL 322 provides a clock signal 327 to the chopper 326 and a clock signal 329 to the chopper 328. If desired, the PLL 322 multiplies the input clock signal 324. The divider/programmable chopper 326 divides and chops the input clock signal 327 as desired resulting in a clock signal 330 which is provided to the core. The term "chopping" is used to described the process of selectively eliminating certain pulses in the signal. In other words, a signal having four pulses can be manipulated into a signal have only one pulse by "chopping" three of the pulses. The pulses may be eliminated in any suitable manner. Similarly, the programmable divider/chopper 328 divides and chops the input signal 329 resulting in a clock signal 332 which is provided to the peripheral logic. In the preferred embodiment, the divider/programmable chopper 326 always divides by two. However, in other embodiments the clock signal could be divided by other amounts or could be programmable. The programmable divider/chopper 328 divides the clock signal 329 by an amount dependent upon a control signal 334 from the tester 312. The resulting signals 330 and 332 provide clock signals used for testing. As a result of the configuration of the choppers 326 and 328, the frequency of signal 330 (chopped clock) will be greater than or equal to the frequency of the signal 332 (base clock) by a desired factor. For the purposes of this description, an "interval" will be defined as one period of the clock signal 332 (the base period).

The choppers 326 and 328 may take on many forms. For example, the choppers could use programmable dividers or non-programmable dividers. Also, the choppers could be separated from the dividers. Also, the present invention is not limited to two clock domains such as that shown in FIG. 3. Additional choppers can be added to provide as many clock domains as desired.

As mentioned above, the present invention has the capability of manipulating the clock signals in any desired manner. Following is a description illustrating one example of how the waveforms can be manipulated using the choppers 326 and 328 for use with scan testing.

Figure 4:
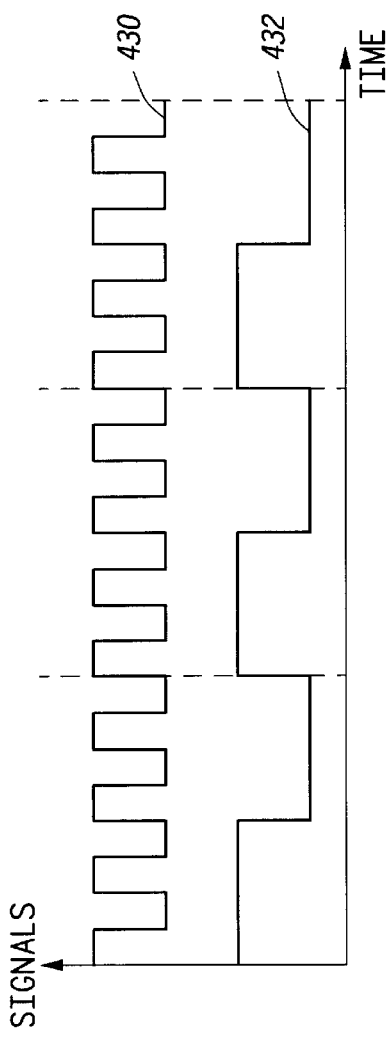
FIG. 4 is a timing diagram illustrating unchopped clock signals generated by the programmable clock generator of the present invention.

FIG. 4 is a timing diagram illustrating two clock signals 430 and 432 which correspond to the signals 330 and 332 generated by the divider/programmable chopper 326 and the programmable divider/chopper 328, respectively. Note that the signals 430 and 432 shown in FIG. 4 are not chopped. The choppers 326 and 328 have the capability of chopping any of the pulses of the signals. In this way, the choppers 326 and 328 can manipulate the waveforms of signals 430 and 432 in any way desired.

While the choppers 326 and 328 can be controlled in many ways, the preferred method is described as follows. The following example provides for eight separate combinations of waveforms for the signals 330 and 332. Of course, more or less combinations are possible. The following examples also assume that the frequency of the signal 330 is four times the frequency of the signal 332. Note that this is also variable, as other choppers may allow other ratios by adding bits to the register. Also, in this example, waveforms are chosen to enable at-speed scan-based testing in a manner to perform timing verification tests. In this example, the unchopped signal 330 is comprised of four pulses per interval as shown in FIG. 4. Therefore, the signal 430 may be chopped to provide up to 16 possible waveforms per interval. In one embodiment, the chopper 326 is controlled by a four-bit bus 336. Similarly, the chopper 328 is controlled by a one-bit control signal 338. FIG. 3 shows a chop register bank 340 comprised of eight registers 342. In this example, each register 342 is a five-bit register, where four bits determine the signal on the four-bit bus 336 and one bit determines the value of the control signal 338. With eight registers 342, eight possible combinations of waveforms for the signals 330 and 332 may be provided. If more or less waveforms are desired, more or less registers 342 may be used. While this example addresses a five-bit register for controlling a 4:1 divide by ratio, note that the same 5 bit register could also accommodate a 3:1, 2:1, or 1:1 ratio. For example, if the device is running in 3:1 mode, only the least significant three core clock bits would need to be programmed, or for 2:1 mode, only the least significant two core clock bits would need to be programmed, etc.

The chop register bank 340 may take on many forms. For example, the number of registers can be varied depending on the desired number of waveforms needed. In addition, each register 342 may contain more or less than five bits depending on the number of waveform pulses that require chopping. In addition, the chop register bank 340 may be replaced with two or more register banks, each controlling one chopper. In this embodiment, each register bank would have its own multiplexer and would be controlled by separate control signals.

The eight registers 342 are filled with predetermined waveform values (chopper information) during the reset of the chop scan mode (the scan mode which uses the clock chop mode). In addition to the reset setup, values for the registers 342 can be scanned into the registers 342 to produce any waveform desired. In this case, the scanned waveforms will remain in the registers 342 without being overwritten at reset. In one example, eight registers are scan inserted to create a scan chain with 40 elements.

Figure 5:
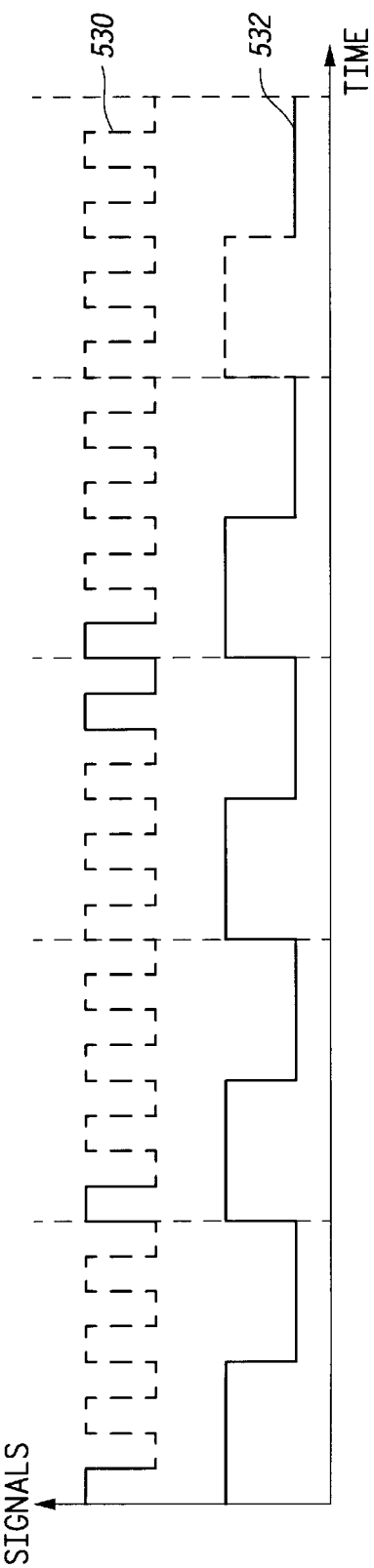
FIG. 5 is a timing diagram illustrating one example of scan testing waveforms generated by the programmable clock generator of the present invention.
Figure 6:
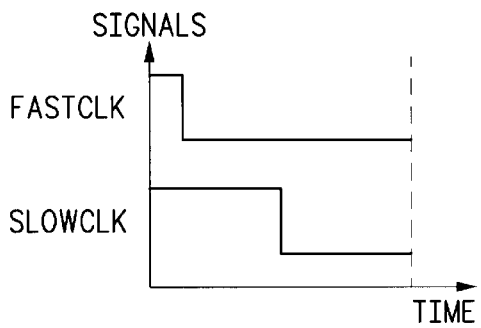
FIGS. 6–13 illustrate one example of eight possible waveforms which could be stored in the eight five-bit shift registers shown in FIG. 3.
Figure 7:
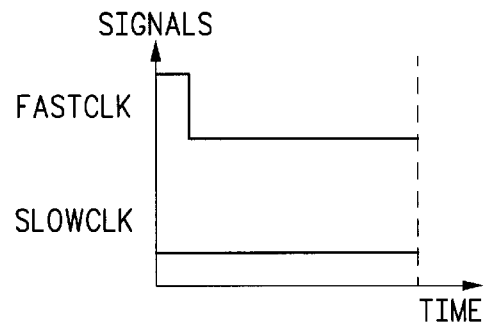
Figure 8:
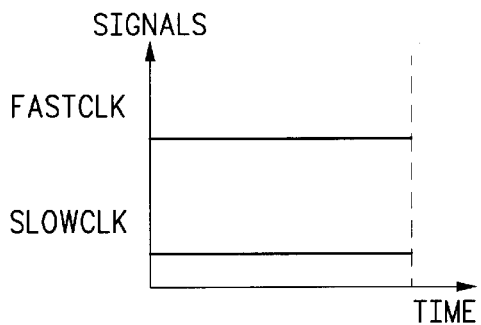
Figure 9:
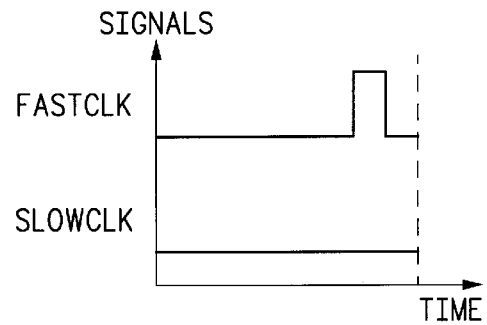
Figure 10:
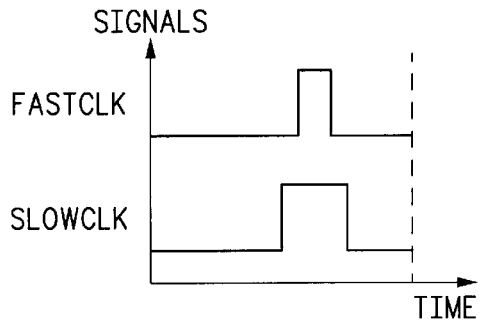
Figure 11:
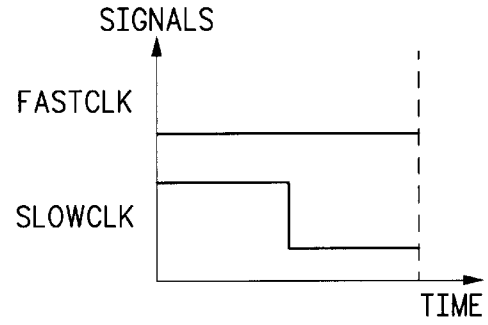
Figure 12:
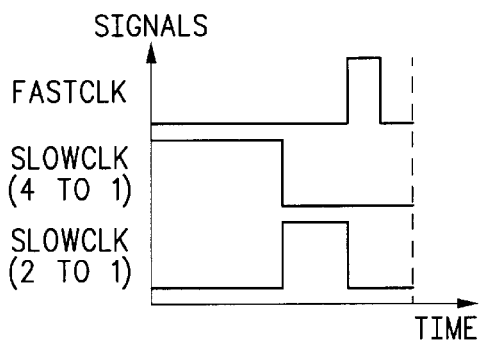
Figure 13:
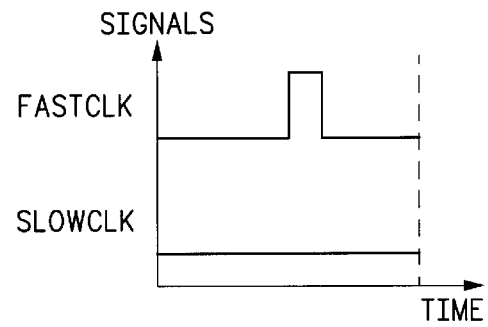

FIGS. 6–13 illustrate an example of eight waveforms which may be stored in the shift registers 342 shown in FIG. 3. FIGS. 6–13 also show the value of the three bit chop control signal 346 which corresponds to each waveform and controls the resulting waveform, and therefore, the location of the pulse in the base period. In the figures, the top signal represents a fast clock ("fastclk") corresponding to clock signal 230 (FIG. 2) and a slow clock ("slowclk") corresponding to clock signal 232. FIG. 6 shows clocks at a 4:1 ratio, with all but one pulse of the fastclk clock chopped. This waveform may be used for a shift cycle or a capture cycle for both clocks (see FIG. 5, for example). FIG. 7 shows clocks at a 4:1 ratio, with all but one pulse of the fastclk clock chopped and the slowclk clock chopped. This waveform may be used for a core shift or capture cycle. FIG. 8 shows a dead clock cycle with all pulses chopped. FIG. 9 shows clocks at a 4:1 or 2:1 ratio, with all but one pulse of the fastclk clock chopped and the slowclk clock chopped. This waveform may be used for a core launch cycle. FIG. 10 shows clocks at a 2:1 ratio, with all but one pulse of the fastclk clock chopped. This waveform may be used for a simultaneous shift or capture with both clocks or launch for asic. FIG. 11 shows clocks at a 4:1 or 2:1 ratio, with all of the pulses of the fastclk clock chopped. This waveform may be used for shift, launch or capture with the peripheral clock only (the peripheral clock cycle is equivalent to the base interval). FIG. 12 shows three clocks at 4:1 and 2:1 ratios, with all but one pulse of the fastclk clock chopped. This waveform may be used for simultaneous launch of the core and peripheral clock at 2:1 or 4:1. FIG. 13 shows clocks at a 2:1 ratio, with all but one pulse of the fastclk clock chopped and the slowclk clock chopped. This waveform may be used for a core shift. It can be seen that the waveforms can be controlled in any desired manner to produce waveforms having pulses with desired pulse widths or with pulses widths at a predetermined fraction of the base period.

Values of the control signals 336 and 338 are selected among the registers 342 via the multiplexer 344 which is controlled by register select control signal 346. In one embodiment, the register select control signal 346 is comprised of three pins on the IC. In this way, by controlling the register select control signal 346, any of the waveforms represented by the eight registers 342 may be implemented on an interval-by-interval basis.

Following is an example of the implementation of one embodiment of the present invention for use in scan testing of an integrated circuit such as IC 210 shown in FIG. 2. When implementing the present invention for scan testing, several limitations of scan testing must be observed. First, only one pulse per clock per interval is allowed. Also, for certain devices it is required to test the functional logic at-speed.

FIG. 2 shows a number of scan chains 250 formed in the core 214 and peripheral logic 216. Each of the scan chains 250 is comprised of a plurality of elements 252. The elements 252 may be comprised of various components, for example, flip-flops, which may be used as data processing registers or scan test registers. Each of the elements 252 in each scan chain 250 are connected together by scan data connections. During scan testing, test data is shifted into the elements 252 until all elements are full. Then a capture cycle is performed to allow the test data to flow through the functional logic. As shown in FIG. 2, this test data comes from the tester 212 via connection 254. To do compares on the test data that has been captured, the tester 212 reads the test data via connection 256.

FIG. 5 illustrates a timing diagram showing clock signals 530 and 532 which correspond generally to signals 230 and 232 shown in FIG. 2. Signals 530 and 532 illustrate just one example of the waveforms which can be generated during scan testing. This example shows the at-speed launch to capture in both the core clock and peripheral clock domains. In this example, three different waveforms are utilized. In FIG. 5, the first two intervals shown act as shift intervals. During the shift interval, all but the first pulse (the pulse in the earliest location) of the signal 530 are chopped and the pulse in signal 532 is not chopped. In FIG. 5, the "chopped" pulses are represented by dashed lines. The third interval shown in FIG. 5 is the launch interval. During the launch interval, all but the last pulse (the pulse in the last location) of the signal 530 are chopped and the pulse of the signal 532 is not chopped. The next interval shown in FIG. 5 is the capture interval. During the capture interval, all but the first pulse of the signal 530 are chopped and the pulse of the signal 532 is not chopped. Note that this is the same waveform as was used for the shift intervals. The launch waveform is manipulated such that it allows for at-speed testing of the functional paths. As can be seen, the distance between unchopped pulse in the launch waveform and the pulse in the capture waveform is small, in this example, one fourth of one interval. As a result, the at-speed launch-to-capture is tested at four times the speed of the clock signal 532. In the last interval, all of the pulses of the signals 530 and 532 are chopped to allow for setup of the next shift interval by creating a dead clock cycle. It can also be seen that other ratios (of clock signals 530 and 532) can be used to test at higher or lower speeds.

It can also be seen that by manipulating the waveforms 530 and 532 by selectively chopping pulses, a large number of waveforms are possible. For different types of testing or other applications, different waveforms may be desired.

As mentioned above, the values of the registers 342 of the chopped register bank 340 determine the waveforms of the signals 530 and 532. In one example, the first four bits of each register 342 corresponds to each of the pulses during one interval of the signal 530. For each bit that is equal to 1, the corresponding pulse is chopped. Of course, the values of 0 or 1 could be swapped. Similarly, the fifth bit of each register 342 corresponds to the pulse of the signal 532. In a similar manner if the fifth bit is equal to 1, the pulse of signal of 532 is chopped.

In integrated circuits having a PLL with a feedback clock for phase alignment, the feedback clock cannot be chopped. Therefore, another clock can be generated in addition to the existing PLL output clock for use as the feedback clock, along with a clock tree delay-matching cell, where the delay matches the delay of the original feedback clock tree.

In another embodiment of the present invention, a PLL is provided with no input clock (such as clock 324 in FIG. 3) from the tester. In this embodiment, an output clock from the PLL is provided to the tester to clock the tester.

In another embodiment of the present invention, a PLL and one or more dividers are integrated together to create a PLL/divider which can be used with one or more choppers to provide the same functionality as the PLL 322, divider/programmable chopper 326, and programmable divider/chopper 328. In this embodiment, an undivided VCO clock signal (in addition to the clock domain signals) is provided to the chopper(s). The purpose of the VCO clock signal is to allow for accurately changing the register select signal(s) 346 on-the-fly such that the new desired waveform represented by one of the eight registers 342 may be chosen for chopping pulses (or not) during the next interval.

While the present invention has been described with respect to scan testing, the present invention may be used with other types of tests. For example, the present invention may be used with built-in self test (BIST), system debugging, etc.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. An integrated circuit having a test mode, comprising:
    a programmable clock generator having an input for receiving a test clock input generated external from the integrated circuit, a first output, and a second output;

a core for performing data processing which has an input coupled to the first output of the integrated circuit and comprises a first plurality of registers that are usable as data processing registers and scan registers;

a peripheral logic circuit having a second plurality of registers which are usable as logic registers and scan registers; and a test controller, coupled to the core and the peripheral logic circuit, having an input for receiving at least a control signal generated external to the integrated circuit, wherein during the test mode the programmable clock generator is further characterized as generating a base clock having a base period and a chopped clock at the fist output comprising a series of pulses of a firs t pulse width, wherein the first pulse width is less than or equal to approximately one half of the base period and wherein the pulses occur no more than once per base period; and wherein the programmable clock generator is further characterized as providing a pulse of the series of pulses selectable at any location within the base period, said location selected by a chop control signal provided external from the integrated circuit, wherein said provided pulse is provided before any other pulse that is within the base period is provided by the programmable clock generator.

2. The integrated circuit of claim 1, wherein the pulse of the series of pulses is selected to be located at one of at least four locations.

3. The integrated circuit of claim 2, wherein the programmable clock generator provides consecutive first and second pulses in consecutive first and second base periods, wherein the first pulse is at a last location of the first base period and the second pulse is at an earliest location of the second base period.

4. A method for testing an integrated circuit having a predetermined function and comprising scan test registers, comprising:

providing a programmable clock pulse means on the integrated circuit for generating a clock pulse which occurs at one pulse per base period at a programmable location within the base period, wherein said generated clock pulse is generated before any other pulse that is within the base period is generated by the programmable clock pulse means:

loading test data into the scan register from a source external to the integrated circuit in response to the clock; and performing a timing verification test in response to the clock pulse after the completion of loading the test data;

wherein the clock pulse for all but the last load of test data occurs in response to the clock pulse being in a first location within the base period, the last load occurs in response to the clock pulse being in a second predetermined location with in the base period and is different form the first predetermined location, and the performing the timing verification occurs in response to the clock pulse being at a third predetermined location within the base period, wherein said third predetermined location is different from the second predetermined location.

5. An integrated circuit, comprising;

a circuit having a predetermined function and comprising scan test registers loaded in response to a clock pulse; and a programmable clock generator means, having an input for receiving an external clock defining a base period, for providing the clock pulse to the scan test register at one pulse per base period at selectable locations in the base period wherein said provided clock pulse is provided before any other pulse that is within the base period is provided by the programmable clock pulse means.

6. The integrated circuit of claim 5, wherein the programmable clock generator means comprises:

a phase locked loop having an input for receiving the external clock; and a programmable chopper, coupled to the phase locked loop, and having an output which outputs the clock pulse.

7. The integrated circuit of claim 6, wherein phase locked loop is further characterized as multiplying the external clock.

8. The integrated circuit of claim 7, wherein the programmable clock generator comprises:

a plurality of registers which store chopper information; and a mulitplexer, coupled to the plurality of registers, having an output coupled to the programmable chopper.

9. The integrated circuit of claim 8, wherein the multiplexer has a control input for receiving an external control signal.

10. The integrated circuit of claim 9, wherein the programmable chopper is further characterized as being a divider.

* * * * *

UNITED STATES PATENT AND TRADEMARK OFFICE
CERTIFICATE OF CORRECTION

PATENT NO. : 6,598,192 B1  Page 1 of 1
DATED : July 22, 2003
INVENTOR(S) : Teresa L. McLaurin et al.

It is certified that error appears in the above-identified patent and that said Letters Patent is hereby corrected as shown below:

Column 7,
Line 16, change "firs t" to -- first --.

Column 8,
Line 9, change "form" to -- form --.
Line 23, insert -- , -- after "period".

Signed and Sealed this

Fourteenth Day of September, 2004

JON W. DUDAS
*Director of the United States Patent and Trademark Office*